United States Patent [19]

Hirano

[11] Patent Number: 5,406,522
[45] Date of Patent: Apr. 11, 1995

[54] DYNAMIC RANDOM ACCESS MEMORY DEVICE AND INSPECTION METHOD THEREOF

[76] Inventor: Hiroshige Hirano, 2-6-27 Tomio-Kita, Nara-shi, Nara-ken, Japan

[21] Appl. No.: 11,279

[22] Filed: Jan. 29, 1993

[30] Foreign Application Priority Data

Jan. 31, 1992 [JP] Japan .................................. 4-015988

[51] Int. Cl.⁶ ............................................... G11C 7/00
[52] U.S. Cl. .................................. 365/222; 324/158.1; 365/200; 365/201; 371/10.2
[58] Field of Search ....................... 365/201, 200, 222; 371/10.2; 324/158 F

[56] References Cited

U.S. PATENT DOCUMENTS

| | | | |
|---|---|---|---|
| 4,406,013 | 9/1983 | Reese et al. | 365/222 |
| 4,423,380 | 12/1983 | Rileri | 365/201 |
| 4,468,759 | 8/1984 | Kung et al. | 365/201 |
| 4,567,432 | 1/1986 | Buol et al. | 324/158 F |
| 4,771,406 | 9/1988 | Oishi et al. | 365/222 |
| 4,871,965 | 10/1989 | Elbort et al. | 324/158 F |
| 4,885,721 | 12/1989 | Katanosaka | 365/200 |
| 4,904,934 | 2/1990 | Nishihashi et al. | 324/158 F |

*Primary Examiner*—Eugene R. LaRoche
*Assistant Examiner*—Christopher R. Glembocki
*Attorney, Agent, or Firm*—Rogers & Wells

[57] ABSTRACT

DRAM devices embodying the present invention have longer potential effective values of refresh interval. A self-refresh interval signal may be set in association with its refresh interval to minimize power consumption during the self-refresh operation mode. An inspection method may pick up DRAM devices with efficiency and without deterioration of yields. When self-refresh interval control signal SELFS assumes the logic level "H" to turn P channel type MOS transistor Qp off and N channel type MOS transistor Qn on, the node N14 is brought to ground voltage VSS. The P channel type MOS transistor Qp and the N channel type MOS transistor Qn determine the time constant at which oscillation is generated. The oscillation output is applied to memory cells of the DRAM devices to enable the self-refresh mode of operation.

18 Claims, 7 Drawing Sheets

P1: normal mode period
P2: redundancy memory cell test mode period

DYNAMIC RANDOM ACCESS MEMORY DEVICE AND INSPECTION METHOD THEREOF

FIELD OF THE INVENTION

This invention relates to a dynamic random access memory device and inspection method thereof.

DESCRIPTION OF THE PRIOR ART

In the recent years, dynamic random access memory devices ("DRAM" hereinafter) have been widely utilized. In particular, the demand is on increase for DRAMs having extended data hold time and extended refresh time in view of battery backup requirements, and DRAMs having self-refresh function. Only conventional self-refresh DRAMs and inspection method thereof are discussed below.

The features of the DRAMs are discussed first. The DRAM stores data by charging charges on capacitors of memory cells and reads data by reading out the charges stored in the capacitors of the memory cells during data read mode. With the passage of time, the charges accumulated on the memory cells capacitors leak and the amounts of the charges decrease.

Therefore, operation is necessary for maintaining or updating the charges whenever a given period of time passes by. The operation for maintaining the charges is called "refresh operation." Usually, an external control signal should be applied to start the refresh operation.

Self-refresh operation, on the other hand, is one which performs refresh operation in response to an internal control signal generated inside the DRAM, i.e., without the external control signal. The charges accumulated on the memory cell capacitors are amplified with sense amplifiers after the refresh operation, including the self-refresh operation, is done. The data are then held through rewriting. To this end, a large current flows to consume power during the operation of the sense amplifiers. Should the data hold time and the interval of the refresh operation be longer, power consumption would be reduced or minimized. This requirement would be most helpful and beneficial to battery backup apparatus and equipments.

FIG. 7 illustrates a conventional self refresh interval circuit for with a self-refresh DRAM.

There are illustrated P channel type MOS transistors Qp-Qp4, N channel type MOS transistors Qn1-Qn4, power supply voltage VCC, ground voltage VSS, self-refresh interval control signal SELFS, self-refresh interval signal T, capacitor C4, resistors R1, R2 and nodes N1-N5.

The self-refresh interval circuit of FIG. 7 is described hereinafter. When the self-refresh interval control signal SELFS is at logic level "L," the P channel type MOS transistor Qp4 is on. This leads to that the self-refresh interval signal T remains settled at logic level "H." Under the circumstance, the self-refresh operation has not been initiated. Once the self-refresh interval control signal SELFS has risen to logic level "H," the P channel type MOS transistor Qp4 is turned off and then channel type MOS transistor Qn4 is turned on. As a consequence, node N4 is brought into the ground voltage VSS. The self-refresh interval circuit then oscillates, which circuit comprises a three-stage NOT circuits of the P channel type MOS transistors Qp1-Qp3 and N channel type MOS transistors Qn1-Qn3 and a time constant circuit of the capacitor C4 and the resistors R1, R2. The oscillation signal at this moment is an oscillation of the self-refresh interval signal T. This oscillation signal enables the refresh operation for refreshing the charges stored in the memory cell capacitors.

FIG. 8 is a flow chart of a conventional DRAM inspection method.

At the beginning of inspection, DC (Direct Current) tests are carried out. This is followed by pattern function tests for checking the operation of all of the memory cells during the normal write and read modes of the memory cells. Then, refresh time function test (specifications I) and redundancy rescue judgement are carried out for the function test.

After the beginning of the inspection, register A is reset to initialize the circuit and carry out the DC tests whereby devices not satisfying the specifications (marked "FAIL") are handled as defective. The devices which passed the tests and satisfied the specifications (marked "PASS") are conveyed to the next pattern function tests.

If the devices FAIL in the pattern function test, then redundancy rescue determination (i.e., replacement by a redundancy cell) is commenced. After the redundancy rescue determination is made, the devices are subjected to the pattern function tests. Where the devices FAIL the tests again, they are handled as defective. On the other hand, when the devices PASS the redundancy rescue determination, the redundancy cell rescue address information thereof is stored in the register A. Those devices, together with perfect devices which PASSED the pattern function tests, are transferred to the next step, that is, refresh time function tests for the specifications I.

In the event that the devices FAIL the refresh time function tests, then they are subject to the redundancy rescue determination. This determination procedure is further followed by the refresh time function tests. If the devices PASS this redundancy rescue determination, then they are given redundancy cell rescue address information at the register A. Those devices are handled as perfect, together with the devices which PASSED the refresh time function test for the specification I. Inspection is completed in this manner. The rescue step of the redundancy rescue address is effected with a laser trimmer which sets up the redundancy rescue address as stored in the register A upon completion of the inspection.

In the conventional DRAM inspection method, however, the redundancy rescue is carded out after a data hold time is checked for a particular specification. Should the devices be checked for the specifications I with moderate data hold time requirements and subjected to the redundancy rescue procedure, they would not often be given the redundancy rescue during the specification II with strict data hold time requirements, and might be handled as defective. On the other hand, even when the devices are checked for the specifications with strict data hold time requirements and the redundancy rescue is effected, the devices would not be eventually given the redundancy rescue and might be handled as defective. In other words, the devices which are rescued by the redundancy rescue procedure and handled as perfect during the specifications I inspection could not survive the specifications II inspection. This causes a problem of a drop in production yield. To avoid such drop in production yield, the conventional inspection method carries out inspection for the specifications I with moderate data hold time requirements and, if necessary, perform the redundancy rescue procedure.

Accordingly, it is impossible to distinguish devices having longer potential effective values of the refresh interval (i.e., devices meeting the specifications II) as PASS devices from others.

If manufacturing deviations are developed, then the interval of a self-refresh interval signal generated from a conventional circuit consisting of a three-stage NOT circuit, capacitor C4 and the resistors R1, R2 would be deviated too. In some instances, the interval of the self-refresh interval signal may become longer than the potential effective value of the refresh interval of the DRAM, that is, the potential effective value of the data hold time of the DRAM divided by the number of refresh operations necessary to refresh all of the memory cells.

In such instances, the self-refresh operation may not be performed within the potential effective value of the refresh interval. To this end, the self-refresh operation fails to maintain the charges on the capacitors. The interval of the self-refresh interval signal becomes fixed and unchangeable even for the devices having very large potential effective values of refresh interval. Therefore, the devices experience a problem of substantial power consumption when the self-refresh operation is performed.

SUMMARY OF THE INVENTION

To solve the above discussed problems, the present invention provides a DRAM device having self-refresh function comprises a self-refresh interval time switch circuit for modifying the interval of the self-refresh function.

The self-refresh interval time switch circuit changes or modifies the interval of self-refresh operation in correspondence with the potential effective value of a data hold time, that is, data hold function.

In another aspect of the present invention, the DRAM device comprises a number of memory cells, a self-refresh function circuit for performing self-refresh operation on the memory cells, a self-refresh interval time switch circuit for changing the interval of the self-refresh operation, and a redundancy memory cell, wherein a defective one of the memory cells is replaced with the redundancy cell at a redundancy rescue address and the interval of the self-refresh operation is changed with the self-refresh interval time switch circuit. It is noted that the capacitance of the redundancy memory cell is higher than the capacitance of the normal memory cells.

In still another aspect of the present invention, a method of inspecting DRAM devices, comprising the steps of performing a plurality of inspections on data hold times of inspection standards, storing redundancy rescue addresses for replacement of defective memory cells found during the respective inspections with redundancy memory cells, and providing the stored redundancy rescue addresses as redundancy rescue addresses for the devices in carrying out, on the devices passing the previous inspection as perfect, one of the inspections with most strict inspection standards.

Furthermore, inspection of the data hold time is carried out at high temperature pursuant to the plurality of the inspection standards.

According to the DRAMs and the inspection method thereof embodying the present invention, the DRAM devices may take advantage of larger potential effective values of the refresh interval and may set the self-refresh interval at a desired value in conjunction with the potential effective value of the refresh interval time. Therefore, DRAMs with a minimum of power consumption during self-refresh operation may be implemented.

Additional features of the present invention are described in relation to the description of the preferred embodiments of the present invention.

DESCRIPTION OF THE PREFERRED EMBODIMENTS

Figure 1:
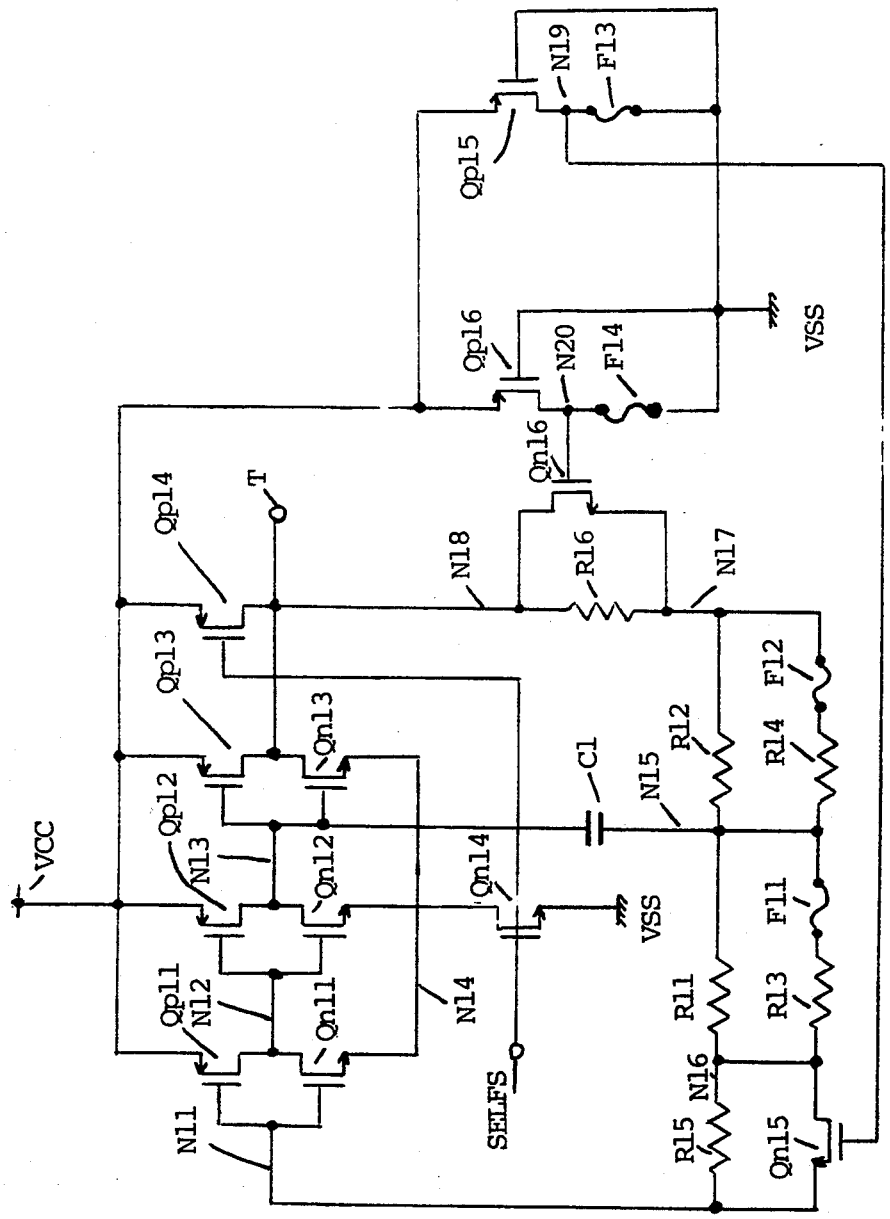
FIG. 1 is a circuit diagram of a self-refresh interval time switch circuit of a self-refresh DRAM according to an embodiment of the present invention.
Figure 2:
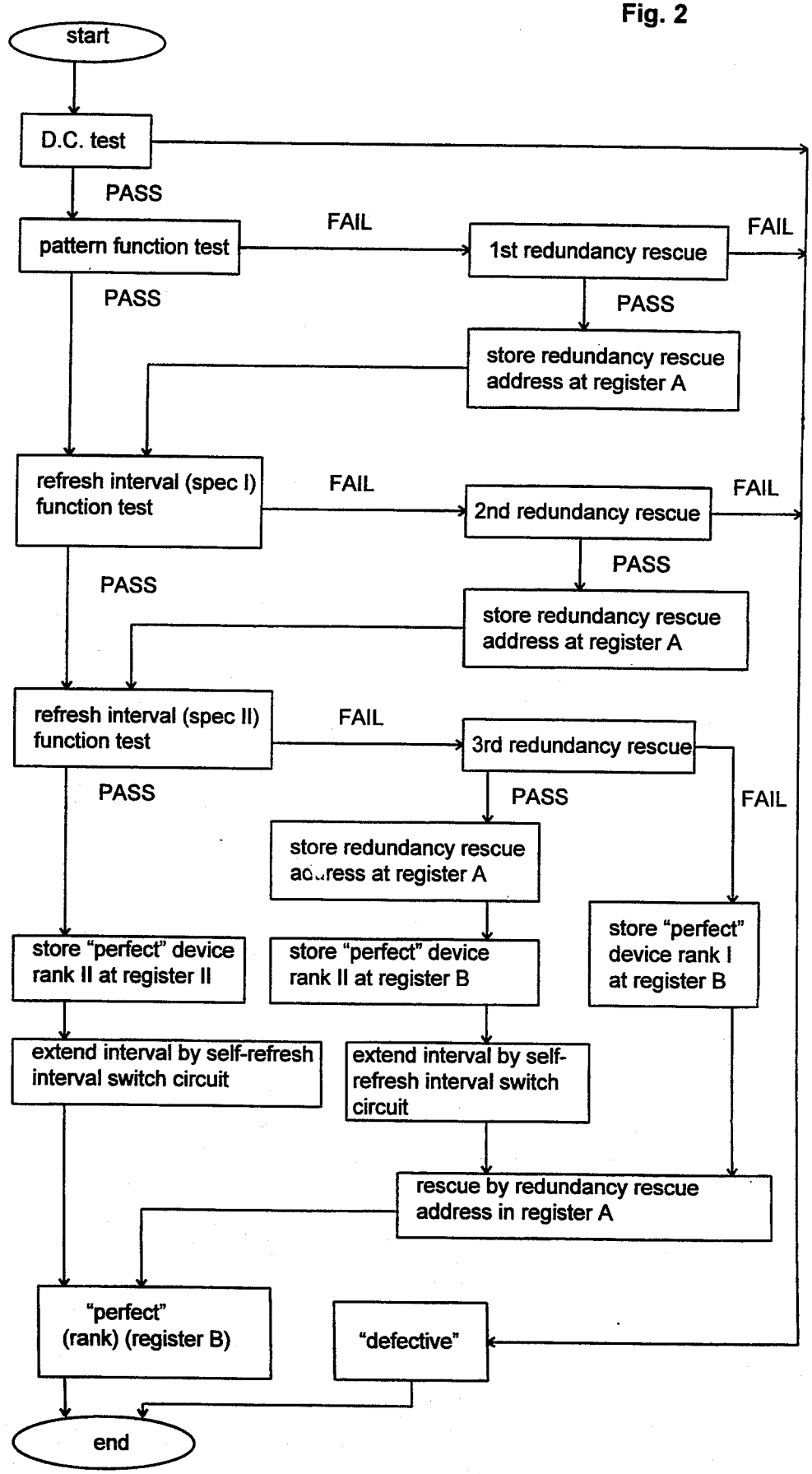
FIG. 2 is a flow chart of inspection procedures for the DRAM according to the embodiment of the present invention.
Figure 4:
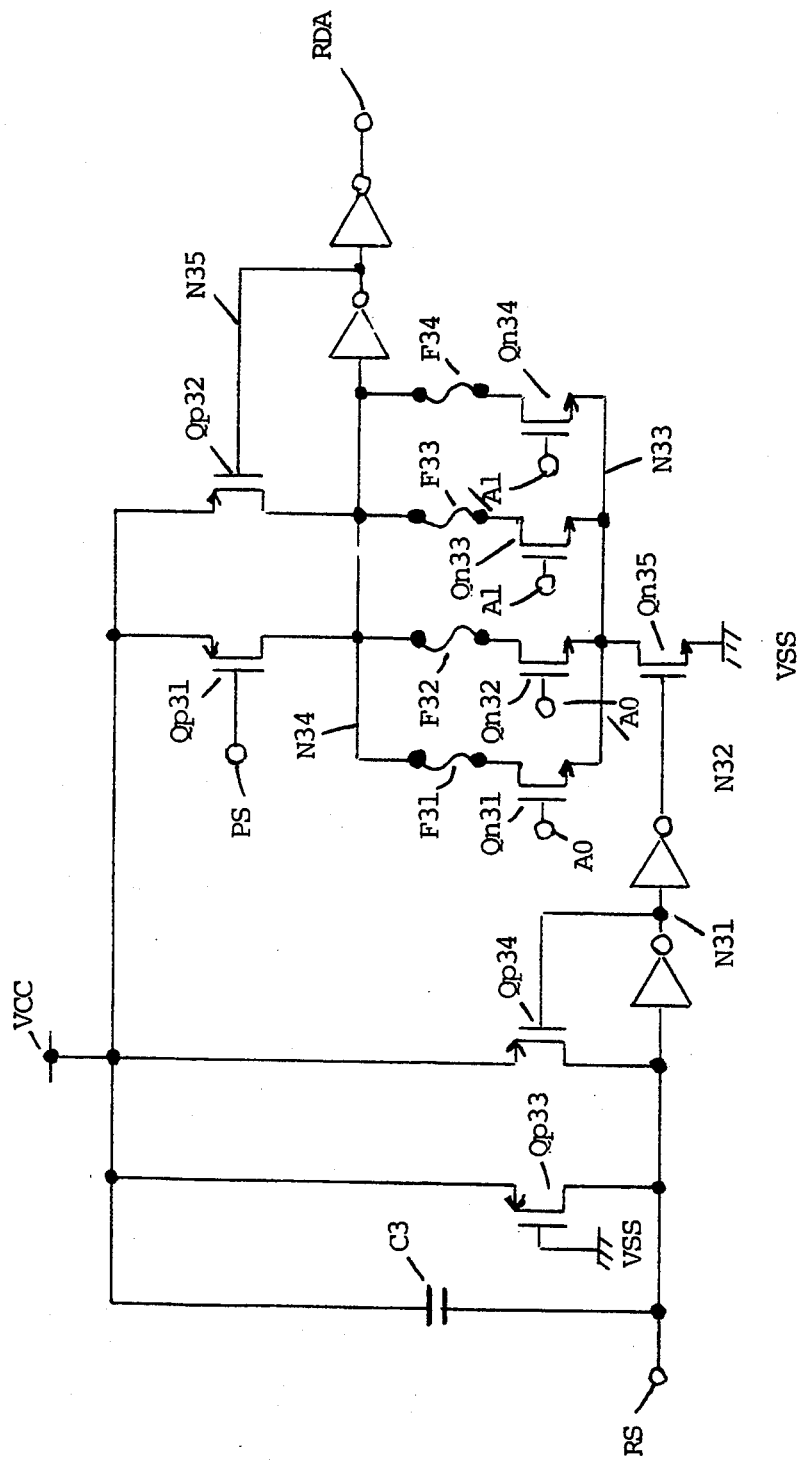
FIG. 4 is a circuit diagram of an example of a redundancy memory cell test circuit according to the present invention.
Figure 5:
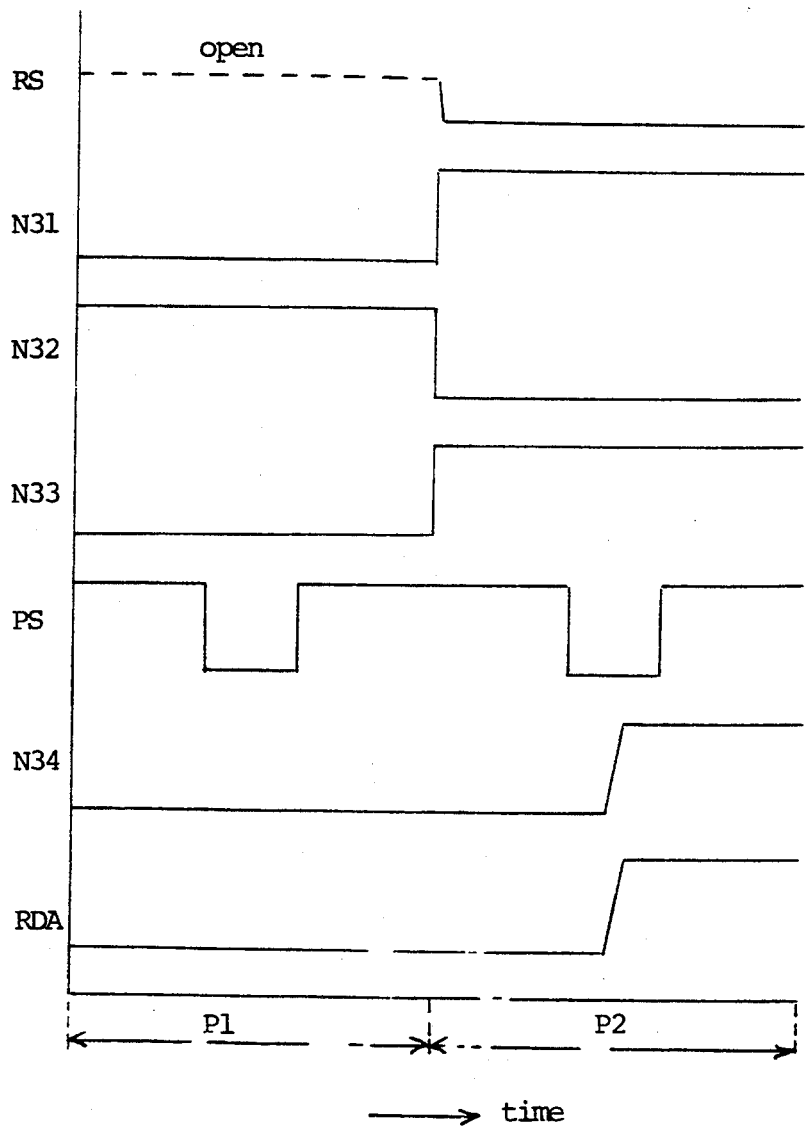
FIG. 5 is an operation timing chart of the redundancy memory cell test circuit according to the present invention.
Figure 7:
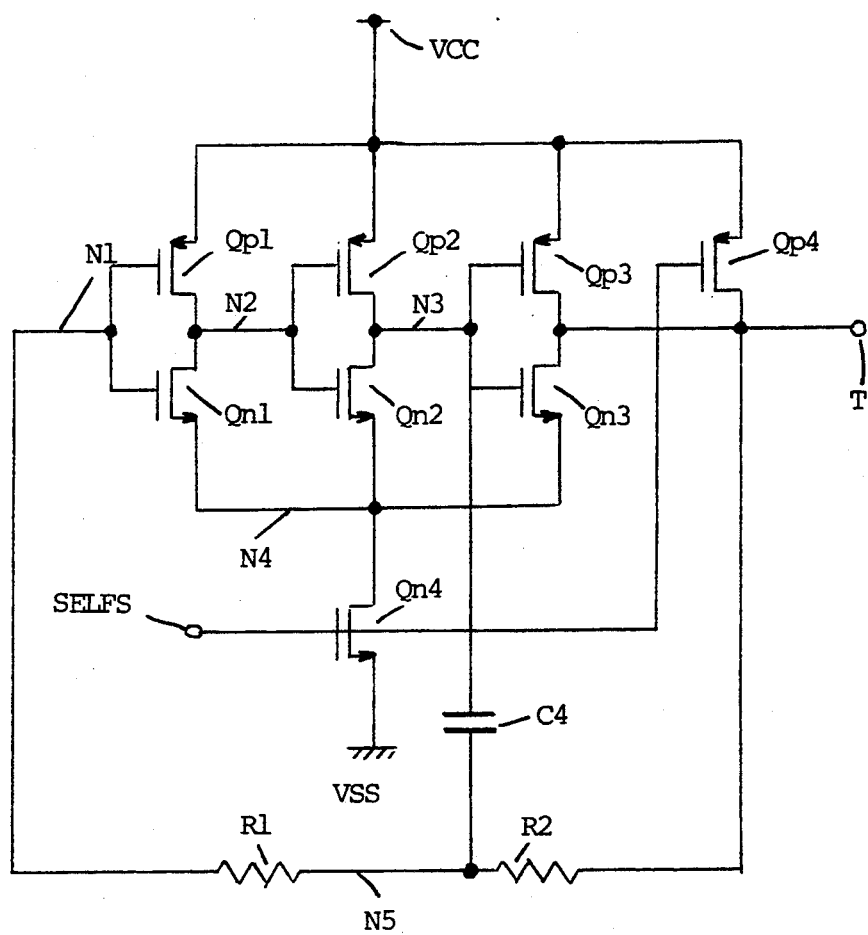
FIG. 7 is a circuit diagram of a self-refresh interval circuit of a conventional self-refresh DRAM.
Figure 8:
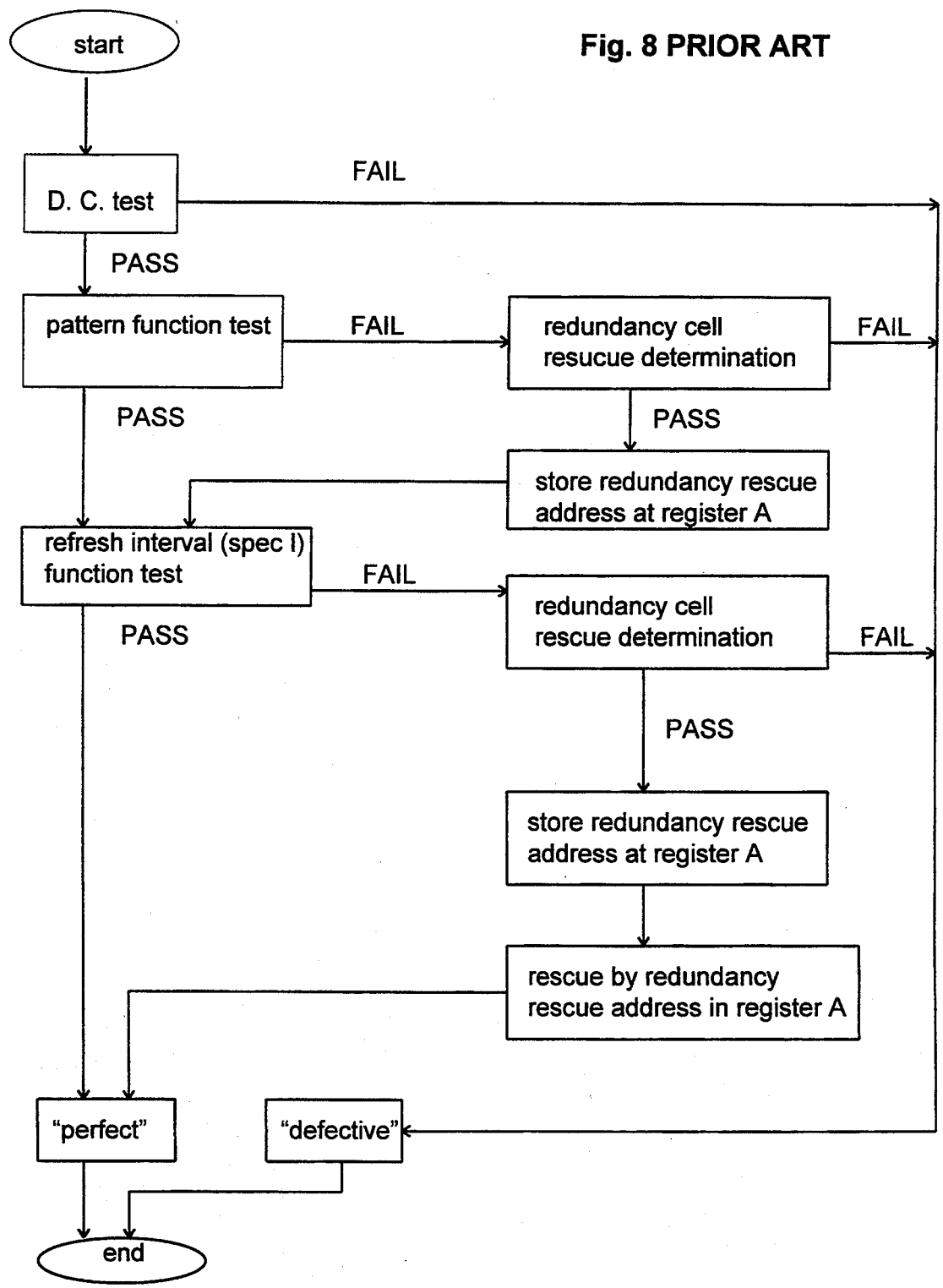
FIG. 8 is a flow chart of a conventional DRAM inspection method.

Referring to accompanying drawings, the present invention will be described. FIG. 1 shows a self-refresh interval time switch circuit of a self-refresh DRAM according to an embodiment of the present invention. FIG. 2 is a flow chart of inspection procedures for the DRAM according to the embodiment of the present invention. FIG. 4 illustrates an example of a redundancy memory cell test circuit, and FIG. 5 is an operation time chart thereof.

There are illustrated P channel type MOS transistors Qp11–Qp34, N channel type MOS transistors Qn11–Qn35, power supply voltage VCC, ground voltage VSS, self-refresh interval control signal SELFS, self-refresh interval signal T, redundancy memory cell test signal RS, precharge signal PS, redundancy memory cell select signal RDA, address signals A0,/A0, A1,/A1, fuses F11–F34, capacitors C1–C3, resistors R11–R16, nodes N11–N16. Normal mode period is denoted as P 1 and redundancy memory cell test mode period as P2.

The self-refresh interval circuit of FIG. 1 with the self-refresh interval switch circuit will be discussed.

In the circuit arrangement, the sources of Qp11–Qp14 are connected to the power supply voltage VCC and the sources of Qn11–Qn13 are connected to the node N14. The node N11 is connected to the gates of Qp11, Qn11. The node N12 is connected to the drains of Qp11, Qn11 and the gates of Qp12, Qn12. The node 13 are connected to the drains of Qp12, Qn12 and the gates of Qp13, Qn13. The self-refresh interval signal T is coupled with the drains of Qp13, Qn13. Qn14 is interposed between the node N14 and the ground voltage VSS. Further, the self-refresh interval control signal SELFS is coupled with the gates of Qn14, Qp14. The resistors R16 and Qn16 are connected in parallel between the self-refresh interval signal T (node N18) and the node N17. The resistor R12 is placed between the nodes N17 and N15. A series circuit of the resistor R14 and the fuse F12 is connected between the nodes N17 and N15. The resistor R11 is connected between the nodes N15 and N16, and a series circuit of the resistor R13 and the fuse F11 is further connected between the nodes N15 and N16. A parallel circuit of the resistor R15 and Qn15 is connected between the nodes N16 and N11. The capacitor C1 is connected between the nodes N15 and N13. The sources of Qp15–Qp16 are connected to the power supply voltage VCC, while the gates of Qp15–Qp16 are connected to the ground voltage VSS. The drain of Qp15 is connected to the node N19 and the gate of Qn15. The drain of Qp16 is connected to the node N20 and the gate of Qn16. The fuse F13 is disposed between the node N19 and the ground voltage VSS, while the fuse F14 is disposed between the node N20 and the ground voltage VSS.

The basic operation of the self-refresh interval circuit is as follows: When the self-refresh interval control signal SELF is at logic level "L," the P channel type MOS transistor Qp14 is on to fix the self-refresh interval signal T at logic level "H." At this moment, the self-refresh operation is not enabled.

If the self-refresh interval signal SELFS increases to logic level "H," the P channel type MOS transistor Qp14 turns off and the N channel type MOS transistor Qn14 turns on. To this end, the node N14 lowers to the ground level VSS. Provided that Qp14 turns off and Qn14 on in this manner, a negative feedback loop is established for oscillation by a cascade circuit of three stage NOT circuits of the P channel type MOS transistors Qp11–Qp13 and the N channel type MOS transistors Qn11–Qn13 and a time constant circuit of the capacitor C1 and the resistors R11–R16. The negative feedback loop creates oscillation at an interval as determined by its time constant. Assume now that an input switching voltage to the nodes N11, N13 is VCC/2, the self-refresh interval signal T is represented as follows:

$T = 2.2 \times C1 \times R$ where $R = (R16 + 1)/\{(1/R12) + (1/R14)\}$ The oscillation output, i.e., the self-refresh interval signal T serves to refresh the memory cells of the DRAM. In other words, the self-refresh operation is enabled.

For example, in case of 4 M bit DRAMs, 1024 times of refresh are required to refresh all of the memory cells. Should the dam hold time of the memory cells be 200 msec, for example, the self-refresh interval is set at about $200/1024 = 195.3$ μsec. To initiate the self-refresh operation, SELFS increases to logic level "H." The refresh interval T at this time should be set in correspondence with the data hold time of the memory cells.

In the illustrated embodiment, it is possible to vary the combined resistance of the resistors R11–R16 by breaking particular ones of the fuses F11–F14 and in response to the presence or absence of the particular ones of the fuses. By varying the combined resistance, the time constant as determined by the capacitor C1 and the combined resistance may set the oscillation frequency of the self-refresh circuit at a desired value.

For instance, where all of the fuses F11–F14 are not broken, the P channel type MOS transistors Qp15, Qp16 are on. At this moment, the nodes N19, N20 are grounded via the fuses F13, F14. For this reason, the N channel type MOS transistors Qn15, Qn16 are off. Under the circumstance, all of the resistors R11–R16 influence the value of the time constant. Put in another way, the resistance between the nodes N11 and N15 is represented by $\{1/(1/R11 + 1/R13)\} + R15$. The resistance between the nodes N15 and N16 is defined as $\{1/(1/R12 + 1/R14)\} + R16$.

To extend the oscillation interval of the self-refresh interval signal T, the fuse F11 or F12 may be broken. At this time the resistance between the nodes N11 and N15 is determined by R11+R15. The resistance between the nodes N15 and N18 is also determined by R12+R16. The time constant is increased in this manner.

In some instances, the interval of the self-refresh interval signal may be longer than the potential effective value of the refresh interval of the DRAMs. In such instances, the self-refresh operation may not be performed within the range of the potential effective value of the refresh interval. The result is that charges in the capacitors may be lost and no effective self-refresh operation may be expected. To this end, it becomes necessary to shorten the oscillation interval of the self-refresh interval signal. All that is necessary is break the fuse F13 or F14. When the fuse F13 or F14 is broken, the P channel type MOS transistors Qp15, Qp16 are on. Since the fuse F13 or F14 is broken, the nodes N19 and N20 are not grounded and that the logic level of the nodes N19 and N20 is "H." The N channel type MOS transistors Qn15, Qn16 turn on in this manner. Under the circumstance, the resistance between the nodes N11 and N15 is defined as $1/(1/R11 + 1/R13)$ and that between the nodes N15 and N18 as $1/(1/R12 + 1/R14)$. Accordingly, the value of the time constant is smaller.

FIG. 2 illustrates a flow diagram of a DRAM inspection method. The inspection method illustrated includes DC (Direct Current) tests, memory cell pattern function tests, refresh interval function tests with specifications I, refresh interval function tests with specifications II and redundancy rescue procedures in connection with the function tests.

Upon the beginning of the inspection programs, registers A and B are reset to initialize the circuit arrangement. The registers A and B store variables in the programs. If the registers A and B are reset, there is no redundancy rescue address stored at all.

The DC tests are carried out to check the contact status of input and output terminals of DRAM devices, input leak, and other electric characteristics, including standby current and operating current. The devices which do not satisfy inspection standards (marked "FAIL") are handled as defective. The devices which meet the inspection standards (marked "PASS") are transferred to the pattern function tests.

The pattern function tests are tests for checking if individual memory cells operate normally. For example, simpler tests of the pattern function tests are to write data into all of the memory cells, then read out the data from the all of the memory cells and finally check if the readout data are identical with the written data. At this time the devices are handled as "PASS" as long as the all of the memory cells are normal. In the event that any one (1 bit) of the memory cells is abnormal, the devices are handled as "FAIL." The devices marked "FAIL" are then subjected to the redundancy rescue determination procedure. If the devices FAIL this procedure again, then the devices are disposed of as defective. The redundancy rescue determination procedure is effected in the following order. The memory cell which did not pass the pattern function tests is replaced with a redundancy memory cell. The device with such replacement cell is taken to the pattern function tests again to determine if the subject device may be handled as perfect or non-defective. Where replacement by the redundancy cell makes the device perfect, the outcome of the redundancy rescue determination procedure can be said "PASS." On the other hand, where replacement by the redundancy cell does not cure the device, the outcome of the redundancy rescue determination procedure is "FAIL."

In association with devices marked "PASS" through the rescue determination procedure, the redundancy rescue addresses thereof are stored in the register A. These devices together with the devices marked "PASS" through the pattern function tests are transferred to the refresh interval function test. The refresh interval function tests are memory cell tests, including inspection of the data hold time of the memory cells. For example, specification tests with 200 msec of data hold time are carried out as follows. Data are written into all of the memory cells and upon passage of 200 msec the data are read out from the all of the memory cells. It is then checked whether the readout data are identical with the data when written into the memory cells.

If the readout data are not identical and the subject device is regarded as FAIL during these tests, a second redundancy rescue determination procedure is carded out. The second redundancy rescue determination procedure take steps similar to those in the first redundancy rescue determination procedure. The devices not cured (i.e., FAIL) by the second redundancy rescue determination procedure are disposed of as defective devices.

For the devices marked "PASS" as a consequence of the second redundancy rescue determination procedure, the redundancy rescue addresses thereof are stored in the register A. A second address is rewritten onto the original and first address. Provision of an additional register or the like for the address during the first redundancy rescue determination procedure without rewriting the second address on the first address, is not required to see whether the devices are marked "PASS" or "FAIL." In the case where the extent of defective addresses is appreciable during the pattern function tests, the second address may be written into a different register.

Those devices are transferred to the next inspection step, the refresh interval function tests with the specifications II, together with the devices marked "PASS" during the refresh interval function tests with the specifications I.

When the devices FAIL again, the devices are conveyed to a third redundancy rescue determination procedure. The devices which FAIL the third redundancy rescue determination procedure are stored at the register B as perfect device rank I. The devices which PASS the third redundancy rescue determination procedure are stored at the register B as perfect device rank II. The interval of the self-refresh interval switch circuit is extended as a function of information on the perfect device rank I and perfect device rank II.

The redundancy rescue addresses stored in the register A in connection with both the devices marked "FAIL" and "PASS" during the redundancy rescue determination procedures, cure the devices and make the devices perfect. The register A stores variables as the redundancy rescue addresses, while the register B stores variables as the perfect device rank.

The devices which PASS the refresh interval function tests with the specifications II are stored in the register B as perfect device rank II. The self-refresh interval of these devices is extended with the self-refresh interval switch circuit to thereby make the devices perfect and complete all the inspection steps.

The rescue by the redundancy rescue address and the change of the self-refresh interval are accomplished by breaking the fuses with a laser trimmer after completing the inspection steps. Rescue is provided in the above mentioned manner by the redundancy rescue addresses stored in the register A. The devices which PASS the specifications II do not need redundancy address rescue but need the change of the self-refresh interval.

In particular, the specifications II are the inspection standards more strict than the specifications I. The specifications I are inspection standards when the data hold time of the memory cells is 200 msec, whereas the specifications II are the standards with a data hold time of 500 msec. If the register B contains the perfect device rank I, it means that the data hold time of the memory cells is 200 msec. For example, in case of 4 M bit DRAMs, 1024 times of refresh is required to refresh all of the memory cells. To this end, the refresh interval is set at 200 msec / 1024=195.3 $\mu$sec. Should the register B contain the perfect device rank II, the data hold time of the memory cells is 500 msec and the refresh interval is 500 msec/ 1024=488.3 $\mu$sec. The interval of the self-refresh operation is set to be longer for the DRAMs having a longer data hold time of the memory cells thereof. Self-refresh current during the self-refresh operation is minimized by expanding the interval of the self-refresh operation.

Figure 3:
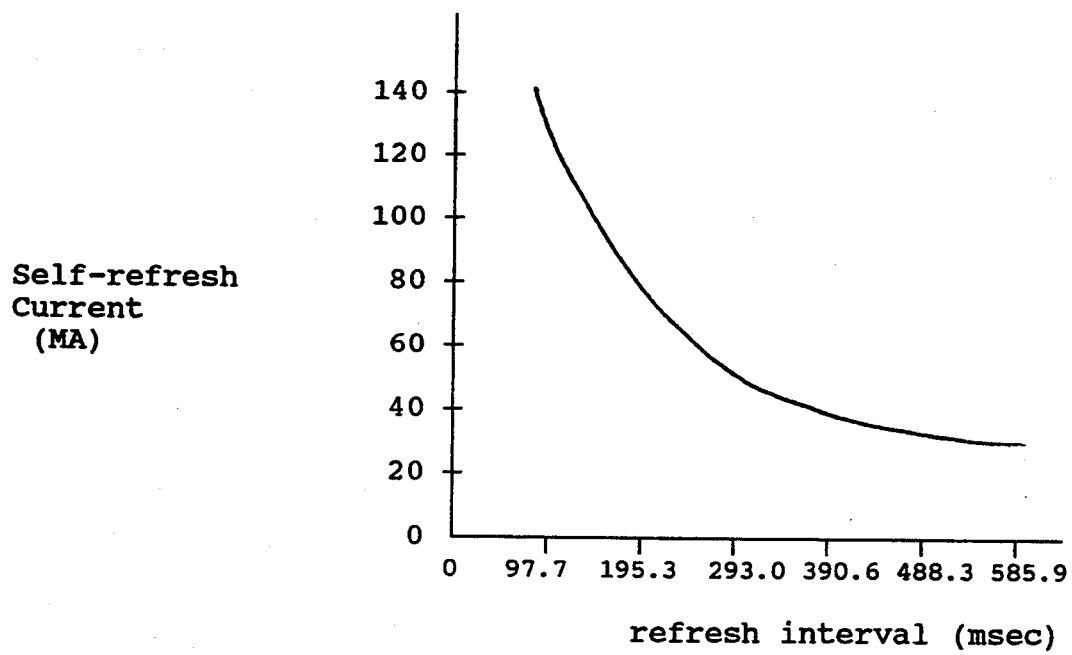
FIG. 3 is a graph showing the relationship between refresh current and refresh interval.

FIG. 3 is a graph showing the relationship between the interval of the self-refresh operation and the self-refresh current. The graph is scaled with the interval of the self-refresh operation on abscissa and the self-refresh current values on ordinate, indicating that the two are in inverse proportion to each other. In other words, the self-refresh current becomes smaller with extension of the interval of the self-refresh operation. As is obvious from FIG. 3, the interval of the self-refresh operation is 195.3 $\mu$A and the self-refresh current is 75.5 $\mu$A when the data hold time of the memory cells is 200 msec. In addition, when the data hold time of the memory cells is 500 msec, the interval of the self-refresh operation is 488.3 $\mu$sec and the self-refresh current is 36.2 $\mu$A. It is, therefore, evident that the self-refresh current is reduced to a half for the devices having 500 msec of data hold time.

According to the inspection method of the present invention, the devices having more than 200 msec of memory cell data hold time are handled as perfect and those having 500 msec of memory cell data hold time are handled to take advantage of the redundancy rescue procedure to a maximum possible extent. This provides improved manufacturing yields.

In the conventional inspection method, however, the devices having more than 200 msec of memory cell data hold time were handled as perfect, so that the devices having a memory cell data hold time longer than 200 msec and shorter than 500 msec could not take full advantage of the redundancy rescue procedure. As a result, the devices having a memory cell data hold time longer than 500 msec are very few among the devices passing through the conventional inspection method.

Further, provided that the devices having a memory cell data hold time longer than 500 msec had been handled in the conventional inspection method, the devices having a data hold time longer than 200 msec and shorter than 500 msec would have been handled as defective, with resulting deterioration of yields. The inspection method of the present invention, on the contrary, permits the manufacturing of the devices having a longer memory cell data hold time, without experiencing deterioration of yields.

Moreover, the memory cell pattern function tests, the refresh interval function tests with the specifications I and II as described above may also be carded out on the redundancy memory cells through the use of a redundancy memory cell test circuit to be discussed below.

An example of the redundancy memory cell test circuit of FIG. 4 will be described with reference to FIG. 5 showing an operation timing chart.

RDA is a redundancy memory cell select signal. Where the logic level of RDA is "H," the redundancy memory cells are selected. Where the logic level of RDA is "L," the normal memory cells are selected. RS is a redundancy memory cell test signal.

The normal operation mode will be described first. In FIG. 5 or the operation time chart, the redundancy memory cell test signal RS is open during the normal mode period P1. The P channel type MOS transistor Qp33 under on condition brings RS to the logic level "H." Under the circumstance, the node N31 is at the logic level "L," turning the P channel type MOS transistor Qp34 on and fixing or latching RS at the logic level "H." At this moment, the node N32 is at the logic level "H," the N channel type MOS transistor Qn34 is on and the node N33 is at the logic level "L."

If a pulse signal of the logic level "L" is applied to the precharge signal terminal PS to turn on the P channel type MOS transistor Qp31, it serves to precharge the node N34 to the logic level "H" once. In other words, the node N34 is first set at the logic level "H" as its initial state. Thereafter, the logic level "H" or the logic level "L" is selected, depending upon whether the fuse is broken. A positive charge precharged at the node N34 is drawn to bring it to the logic level "L." Nothing is done to bring it to the logic level "H." The redundancy cell test circuit performs in the above described manner.

A0,/A0, A1 and/A1 are address signals wherein the address signals/A0,/A1 are the inverse of the address signals A0, A1.

When any one of the redundancy memory cell select fuses F31–F34 is not selected, the node N34 is at the logic level "L" via a respective one of the N channel type MOS transistor Qn3 under on condition. Under the circumstance, the node N35 is at the logic level "H" and the redundancy memory cell select signal RDA is at the logic level "L" so that the normal memory cells are selected. For example, where the address signal A0 is at the logic level "L" and the address signal A1 at the logic level "H," the redundancy memory cell select fuses F32 and F33 are broken if it is desired to select the redundancy memory cells. The result is that the address signal A0 is at the logic level "L" and the address signal/A0 at the logic level "L" so that the N channel type MOS transistors Qn31 and Qn34 are off. At this moment the node N34 is held at the logic level "H." The node N35 is at the logic level "L" and the redundancy memory cell select signal RDA is at the logic level "H," thereby selecting the redundancy memory cells.

The redundancy memory cell test mode will be discussed.

The redundancy memory cell test mode is a mode by which the redundancy memory cells are selected without the need to break the redundancy memory cell select fuses.

In FIG. 5 or the operation timing chart, P2 is the redundancy memory cell test mode period. The redundancy memory cell test signal RS is at the logic level "L" during the redundancy memory cell test mode. To this end, the node N31 is at the logic level "H" and the P channel type MOS transistor Qp34 is off. Under the condition where the node N32 is at the logic level "L," the N channel type MOS transistor Qn35 is off and the node N33 is open. If a pulse signal of the logic level "L" is applied to the precharge signal terminal PS, then the P channel type MOS transistor Qp31 turns on to thereby precharge the node N34 to the logic level "H" once. As a result, the node N35 is at the logic level "L." The P channel type MOS transistor Qp32 is, therefore, on and the node N34 is latched at the logic level "H." Regardless of whether the address signals A0, A1 are at the logic level "H" or the logic level "L," the redundancy memory cell select signal RDA assumes the logic level "H" to select the redundancy memory cell.

The redundancy memory cells may be inspected in this manner by forcedly selecting the redundancy memory cells without the need to break the redundancy memory cell select fuses. It is, therefore, possible to detect a defective redundancy memory cell by forcedly selecting and inspecting the redundancy memory cells without the need to break the redundancy memory cell select fuses. To this end, replacement can be done only with perfect and non-defective redundancy memory cells, i.e., without using defective redundancy memory cells during the redundancy cell rescue procedure, thereby enhancing chance of successful rescue by the redundancy memory cells.

In the flow chart of the DRAM inspection method as shown in FIG. 2, the refresh interval is usually shorter at higher temperatures. The inspection time may thus be shortened by carrying out inspection at high temperature.

Figure 6:
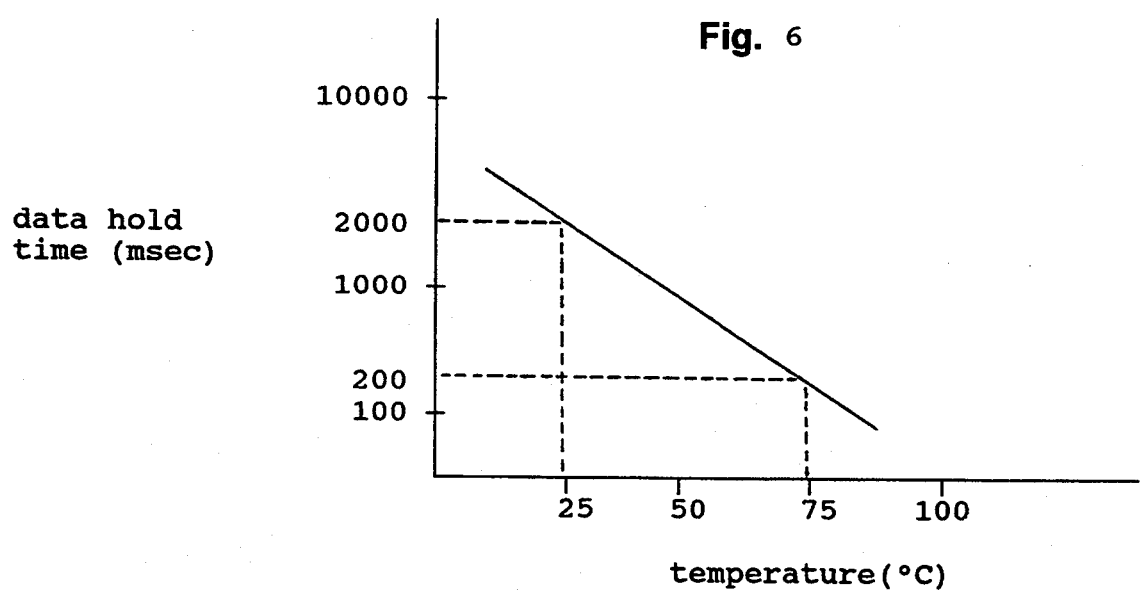
FIG. 6 is a graph showing the relationship between data hold time and temperature.

The relationship between temperature and the data hold time of the memory cells is depicted in FIG. 6. The graph is scaled with temperature on abscissa and the data hold time on ordinate, indicating that the two are in inverse proportion to each other. Such relationship is linear. As can be seen from FIG. 6, the data hold time is 2,000 msec at 25° C. and 200 msec at 75° C. In case of 4 M bit DRAM devices of 1 M bits×4, the inspection time of the devices having 2,000 msec of data hold time at 25° C. is 4,640 msec and the inspection time of the devices having 200 msec of data hold time at 75° C. is 1,040 msec. The inspection time, therefore, is shortened by 22.4%.

To procure devices having longest possible refresh intervals, the DRAM inspection method is carried out pursuant to the flow chart of FIG. 2 and the memory cells having shorter refresh intervals are replaced with the redundancy memory cells. In other words, it is possible to make the capacitance of the redundancy memory cells higher than the capacitance of the normal memory cells by replacing the memory cells having shorter refresh intervals with the redundancy memory cells. The data hold time becomes also longer in proportion to the capacitance of the memory cells. It is, therefore, possible to replace the normal memory cells having shorter data hold times with the redundancy memory cells having longer data hold times.

As discussed previously, the DRAMs and the inspection method and the manufacturing method thereof embodying the present invention are advantageous by supplying a large number of devices having longer potential effective values of the refresh interval and a minimum of power consumption during the self-refresh mode.

The foregoing description and the drawings are illustrative and are not to be taken as limiting. Still other variations and modifications are possible without departing from the spirit and scope of the present invention.

I claim:

1. A dynamic random access memory device comprising a number of memory cells, a self-refresh function circuit for performing a self-refresh operation on the memory cells, a self-refresh interval time switch circuit for modifying the interval of the self-refresh operation, said self-refresh interval time switch circuit comprising a generator for generating at a first interval a self-refresh interval signal whose interval defines the interval of the self-refresh operation, a first means for modifying the first interval of the self-refresh interval signal to a second interval and a second means for modifying the first interval of the self-refresh interval signal to a third interval.

2. A dynamic random access memory device according to claim 1 wherein said self-refresh interval time switch comprises a NOT circuit and a time constant circuit for establishing a negative feedback loop and causing oscillation at the generator at one of the first, second and third intervals as determined by a time constant of the time constant circuit, wherein the first modifying means and the second modifying means are connected to the time constant circuit.

3. A dynamic random access memory device according to claim 2 wherein the interval of the self-refresh operation is determined by the oscillation interval of the generator in the self-refresh interval time switch circuit.

4. A dynamic random access memory device according to claim 3 wherein the oscillation interval of the self-refresh interval time switch circuit is made variable by the first modifying means and the second modifying means.

5. A dynamic random access memory device according to claim 4 wherein the time constant of the time constant circuit is changed by connecting or breaking a first fuse means included in the first modifying means and a second fuse means included in the second modifying means.

6. A dynamic random access memory device comprising a number of memory cells, a self-refresh function circuit for performing a self-refresh operation on the memory cells, a self-refresh interval time switch circuit for modifying the interval of the self-refresh operation, said self-refresh interval time switch circuit comprising a generator for generating at a first interval a self-refresh interval signal whose interval defines the interval of the self-refresh operation, a first means for modifying the first interval of the self-refresh interval signal to a second interval a second means for modifying the first interval of the self-refresh interval signal to a third interval and a means for evaluating a data hold time of respective ones of the memory cells and modifying the first interval of the self-refresh interval signal into the second interval or third interval as a result of the evaluation of the data hold time.

7. A dynamic random access memory device comprises a number of memory cells, a self-refresh function circuit for performing self-refresh operation on the memory cells, a self-refresh interval time switch circuit for changing the interval of the self-refresh operation, and a redundancy memory cell, wherein a defective one of the memory cells is replaced with the redundancy cell at a redundancy rescue address and the interval of the self-refresh operation is changed with the self-refresh interval time switch circuit.

8. A dynamic random access memory device according to claim 7 wherein the capacitance of the redundancy memory cell is higher than the capacitance of the normal memory cells.

9. A method of inspecting DRAM devices including a number of memory cells and redundancy memory cells, comprising the steps of performing a first inspection under a first criteria of data hold time on the memory cells, performing a first rescue check if redundancy rescue is available with the redundancy memory cells, storing first redundancy rescue addresses for replacement of defective memory cells found during the first inspection with the redundancy memory cells, performing a second inspection under a second criterion of data hold time on the memory cells stricter than the first criterion, performing a second rescue check if redundancy rescue is available with the redundancy memory cells during the second inspection, and storing second redundancy rescue addresses for replacement of defective memory cells found during the second inspection with the redundancy memory cells.

10. A method of inspecting DRAM devices according to claim 9 wherein the first and second inspections are carried out at high temperature pursuant to the first and second criteria of data hold time.

11. A method of inspecting DRAM devices according to claim 9 further comprising the step of performing a direct current test, and the step of performing a memory cell pattern function test.

12. A method of inspecting DRAM devices according to claim 11 wherein a memory cell which fails the pattern function test is replaced with a redundancy memory cell through a redundancy cell rescue determination procedure.

13. A method of inspecting DRAM devices according to claim 12, wherein the redundancy cell rescue determination procedure comprises the steps of replacing the memory cells failed with the redundancy memory cell, and carrying out the pattern function test on the redundancy memory cell.

14. A method of inspecting DRAM devices according to claim 9 wherein the memory cells have self-refresh operation whose interval during the first inspection is changed from that of the second inspection.

15. A method of inspecting DRAM devices according to claim 9 wherein the first and second rescue checks include the steps of selecting the redundancy memory cells and checking if they are defective.

16. A method of inspecting DRAM devices including a number of memory cells and redundancy memory cells, comprising the steps of performing a first inspection under a first criterion of data hold time on the memory cells, performing a first rescue check if redundancy rescue is available with the redundancy memory cells, storing first redundancy rescue addresses for replacement of defective memory cells found during the first inspection with the redundancy memory cells, performing a second inspection under a second criterion of data hold time on the memory cells stricter than the first criterion, performing a second rescue check if redundancy rescue is available with the redundancy memory cells during the second inspection, and storing second redundancy rescue addresses for replacement of defective memory cells found during the second inspection with the redundancy memory cells, wherein the memory cells have a self-refresh operation whose self-refresh interval during the first inspection is changed from that during the second inspection and wherein the redundancy memory cells are selected and checked if they are defective and wherein the memory cells having a shorter refresh interval are replaced with the redundancy memory cells, and wherein the capacitance of the redundancy memory cells is greater than that of the memory cells having the shorter refresh interval to make the data hold time longer.

17. A method of inspecting DRAM devices including a number of memory cells and redundancy memory cells, comprising the steps of performing a first inspection under a first criterion on the memory cells, performing a first rescue check if redundancy rescue is available with the redundancy memory cells, storing first redundancy rescue addresses for replacement of defective memory cells found during the first inspection with the redundancy memory cells, performing a second inspection under a second criterion on the memory cells stricter than the first criterion, performing a second rescue check if redundancy rescue is available with the redundancy memory cells during the second inspection, and storing second redundancy rescue addresses for replacement of defective memory cells found during the second inspection with the redundancy memory cells.

18. A method of inspecting DRAM devices including a number of memory cells and redundancy memory cells, comprising the steps of performing a first inspection under a first criterion on the memory cells, performing a first rescue check if redundancy rescue is available with the redundancy memory cells, storing first redundancy rescue addresses for replacement of defective memory cells found during the first inspection with the redundancy memory cells, performing a second inspection under a second criterion on the memory cells stricter than the first criterion, performing a second rescue check if redundancy rescue is available with the redundancy memory cells during the second inspection, storing second redundancy rescue addresses for replacement of defective memory cells found during the second inspection with the redundancy memory cells, and modifying a self-refresh interval time of a self-refresh operation on the memory cells.

* * * * *